United States Patent
Yamamoto

(10) Patent No.: US 11,722,111 B2
(45) Date of Patent: Aug. 8, 2023

(54) PIEZOELECTRIC RESONATOR UNIT AND METHOD OF MANUFACTURING THE SAME

(71) Applicant: Murata Manufacturing Co., Ltd., Nagaokakyo (JP)

(72) Inventor: Hiroyuki Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1098 days.

(21) Appl. No.: 16/369,084

(22) Filed: Mar. 29, 2019

(65) Prior Publication Data

US 2019/0245504 A1  Aug. 8, 2019

Related U.S. Application Data

(63) Continuation of application No. PCT/JP2017/034358, filed on Sep. 22, 2017.

(30) Foreign Application Priority Data

Oct. 11, 2016  (JP) .................... 2016-200140

(51) Int. Cl.
*H03H 3/02* (2006.01)
*H03H 9/19* (2006.01)
(Continued)

(52) U.S. Cl.
CPC .......... *H03H 3/02* (2013.01); *H03H 9/02094* (2013.01); *H03H 9/02133* (2013.01);
(Continued)

(58) Field of Classification Search
CPC .. H03H 3/02; H03H 9/02094; H03H 9/02133; H03H 9/02149; H03H 9/05;
(Continued)

(56) References Cited

U.S. PATENT DOCUMENTS 7,067,966 B2 * 6/2006 Tanaya ............... H03H 9/21
  310/370
8,476,809 B2 * 7/2013 Chen ................ H03H 3/007
  331/154

(Continued)

FOREIGN PATENT DOCUMENTS

EP       1414150 A2 * 4/2004  .......... H03H 9/0547
JP   2004343397 A  * 12/2004
(Continued)

OTHER PUBLICATIONS

International Search Report issued in PCT/JP2017/034358, dated Nov. 7, 2017.
(Continued)

*Primary Examiner* — Jeffrey T Carley
(74) *Attorney, Agent, or Firm* — ArentFox Schiff LLP

(57) ABSTRACT

A method of manufacturing a piezoelectric resonator unit that includes preparing a piezoelectric resonator having a piezoelectric element, a pair of excitation electrodes respectively disposed on a first main surface and a second main surface of the piezoelectric element so as to face each other with the piezoelectric element therebetween, and a pair of connection electrodes that are respectively electrically connected to the pair of excitation electrodes; electrically connecting the pair of connection electrodes to a pair of electrode pads on a third main surface of a base member using an electroconductive holding member so as to excitably hold the piezoelectric resonator on the third main surface of the base member; and attaching an electroconductive material, which is scattered from an electroconductive member, to a surface of the electroconductive holding member.

5 Claims, 10 Drawing Sheets

(51) Int. Cl.
*H03H 9/05* (2006.01)
*H03H 9/10* (2006.01)
*H03H 9/215* (2006.01)
*H03H 9/02* (2006.01)

(52) U.S. Cl.
CPC .......... *H03H 9/02149* (2013.01); *H03H 9/05* (2013.01); *H03H 9/0509* (2013.01); *H03H 9/1021* (2013.01); *H03H 9/19* (2013.01); *H03H 9/215* (2013.01); *H03H 2003/026* (2013.01)

(58) Field of Classification Search
CPC ...... H03H 9/0509; H03H 9/1021; H03H 9/19; H03H 9/215; H03H 2003/026
See application file for complete search history.

(56) References Cited

U.S. PATENT DOCUMENTS

| | | | | |
|---|---|---|---|---|
| 10,476,475 | B2* | 11/2019 | Kawai | H03H 9/176 |
| 2002/0036546 | A1* | 3/2002 | Hatanaka | H03B 5/32 |
| | | | | 331/116 R |
| 2002/0109224 | A1* | 8/2002 | Shimoe | H03H 9/059 |
| | | | | 257/734 |
| 2005/0193548 | A1* | 9/2005 | Nakazawa | H03H 9/1021 |
| | | | | 29/595 |
| 2007/0080758 | A1* | 4/2007 | Nagano | H03H 9/0547 |
| | | | | 333/187 |
| 2008/0129415 | A1* | 6/2008 | Iwai | H03H 9/215 |
| | | | | 216/17 |
| 2010/0308696 | A1* | 12/2010 | Numata | H03H 9/21 |
| | | | | 29/25.35 |
| 2012/0091863 | A1* | 4/2012 | Kitayama | C09J 11/06 |
| | | | | 310/365 |
| 2012/0248938 | A1 | 10/2012 | Kawanishi | |
| 2013/0025931 | A1* | 1/2013 | Oyama | H01L 23/3107 |
| | | | | 156/60 |
| 2013/0264109 | A1* | 10/2013 | Kamakura | H05K 1/181 |
| | | | | 29/832 |
| 2016/0035962 | A1* | 2/2016 | Yamashita | H03H 9/0552 |
| | | | | 310/348 |
| 2017/0345995 | A1* | 11/2017 | Nagahara | H03H 9/0509 |
| 2018/0302033 | A1* | 10/2018 | Yamazaki | H03H 9/02023 |
| 2019/0190486 | A1* | 6/2019 | Sugimasa | H03H 9/0509 |

FOREIGN PATENT DOCUMENTS

| | | | |
|---|---|---|---|
| JP | 2004343397 A | | 12/2004 |
| JP | 2005136705 A | * | 5/2005 |
| JP | 2007081697 A | | 3/2007 |
| JP | 2007220486 A | | 8/2007 |
| JP | 2009303097 A | | 12/2009 |
| JP | 2012217140 A | | 11/2012 |
| JP | 2013145964 A | | 7/2013 |

OTHER PUBLICATIONS

Written Opinion issued in the International Searching Authority issued in PCT/JP2017/034358, dated Nov. 7, 2017.

* cited by examiner

PIEZOELECTRIC RESONATOR UNIT AND METHOD OF MANUFACTURING THE SAME

CROSS REFERENCE TO RELATED APPLICATIONS

The present application is a continuation of International application No. PCT/JP2017/034358, filed Sep. 22, 2017, which claims priority to Japanese Patent Application No. 2016-200140, filed Oct. 11, 2016, the entire contents of each of which are incorporated herein by reference.

FIELD OF THE INVENTION

The present invention relates to a piezoelectric resonator unit and a method of manufacturing a piezoelectric resonator unit.

BACKGROUND OF THE INVENTION

Piezoelectric resonator units are widely used as a signal source of a reference signal used for oscillation devices and bandpass filters. A piezoelectric resonator unit is manufactured, for example, by preparing a piezoelectric resonator and by fixing the piezoelectric resonator to a base member via an electroconductive holding member. For example, a quartz crystal resonator is used as the piezoelectric resonator in view of accuracy and stability of frequency characteristics. Patent Document 1, for example, discloses a tuning-fork-type quartz crystal element that has a base portion and a pair of vibration arms that extend from one end of the base portion, and a quartz crystal element that is cut at a predetermined cut angle, such as AT cut, and that performs thickness shear mode vibration. The electroconductive holding member, which is formed by curing a thermosetting resin that includes electroconductive particles, electrically connects an electrode pad on the base member and a connection electrode on the piezoelectric resonator to each other.

Patent Document 1: Japanese Unexamined Patent Application Publication No. 2009-303097

SUMMARY OF THE INVENTION

When an electroconductive adhesive is heated, for example, in a thermally curing step or an annealing step, electroconductive particles included in the electroconductive holding member may become oxidized. Therefore, when the volume of the electroconductive holding member is reduced as the size of the piezoelectric resonator unit is reduced, the ratio of the surface area to the volume of the electroconductive holding member increases, the effect of oxides of the electroconductive particle increases, and the electric resistance of the electroconductive holding member may increase.

The present invention has been made in consideration of the above circumstances, and an object thereof is to provide a piezoelectric resonator unit and a method of manufacturing a piezoelectric resonator unit with improved electrical reliability.

A method of manufacturing a piezoelectric resonator unit according to an aspect of the present invention includes: preparing a piezoelectric resonator that includes a piezoelectric element, a pair of excitation electrodes that are disposed on a first main surface and a second main surface of the piezoelectric element so as to face each other with the piezoelectric element therebetween, and a pair of connection electrodes that are respectively electrically connected to the pair of excitation electrodes; electrically connecting the pair of connection electrodes to a pair of electrode pads that are disposed on a third main surface of a base member and excitably holding the piezoelectric resonator on the third main surface of the base member using an electroconductive holding member including electroconductive particles; and attaching an electroconductive material, which is scattered from an electroconductive member, to a surface of the electroconductive holding member.

A piezoelectric resonator unit according to another aspect of the present invention includes a piezoelectric resonator that includes a piezoelectric element, a pair of excitation electrodes that are disposed on a first main surface and a second main surface of the piezoelectric element so as to face each other with the piezoelectric element therebetween, and a pair of connection electrodes that are respectively electrically connected to the pair of excitation electrodes; a base member that has a third main surface on which a pair of electrode pads are disposed; an electroconductive holding member that includes electroconductive particles, that electrically connects the pair of electrode pads respectively to the pair of connection electrodes and that excitably holds the piezoelectric resonator on the third main surface of the base member; and an electroconductive material that is disposed on at least a part of a surface of the electroconductive holding member, the part of the surface excluding an interface between the electroconductive holding member and the piezoelectric resonator. The electroconductive material is formed from a material that is the same as a material of an outermost layer of each of the pair of electrode pads.

With the present invention, it is possible to provide a piezoelectric resonator unit and a method of manufacturing a piezoelectric resonator unit with which electrical reliability can be improved.

DETAILED DESCRIPTION OF THE PREFERRED EMBODIMENTS

Hereinafter, embodiments of the present invention will be described. In the following description related to the drawings, elements that are the same as or similar to each other will be denoted by the same or similar numerals. The drawings are exemplary, the dimensions and shapes of elements are schematic, and the technical scope of the present invention is not limited to the embodiments.

Embodiments

Figure 1:
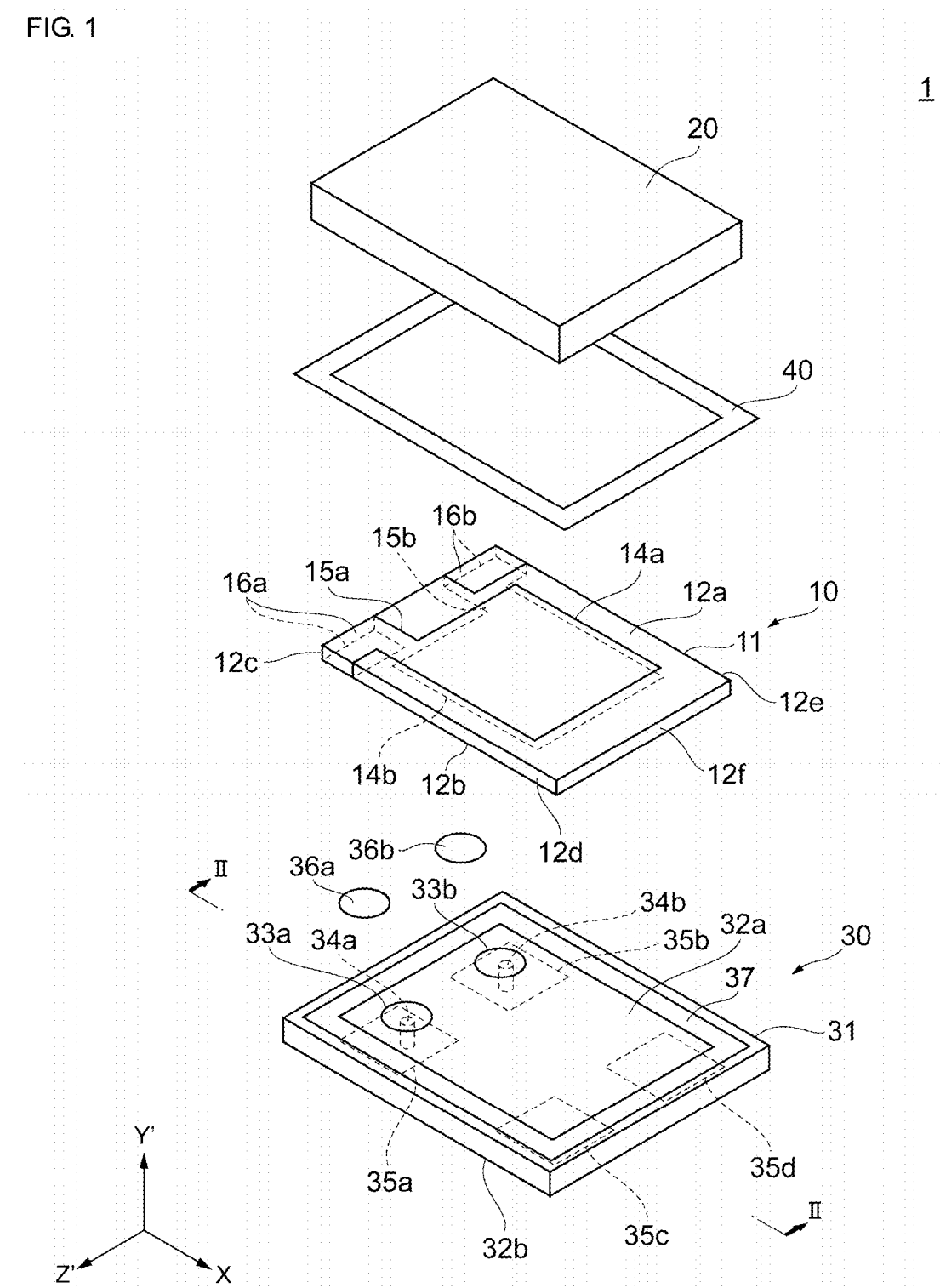
FIG. 1 is a schematic exploded perspective view of a piezoelectric resonator unit according to an embodiment of the present invention.
Figure 2:
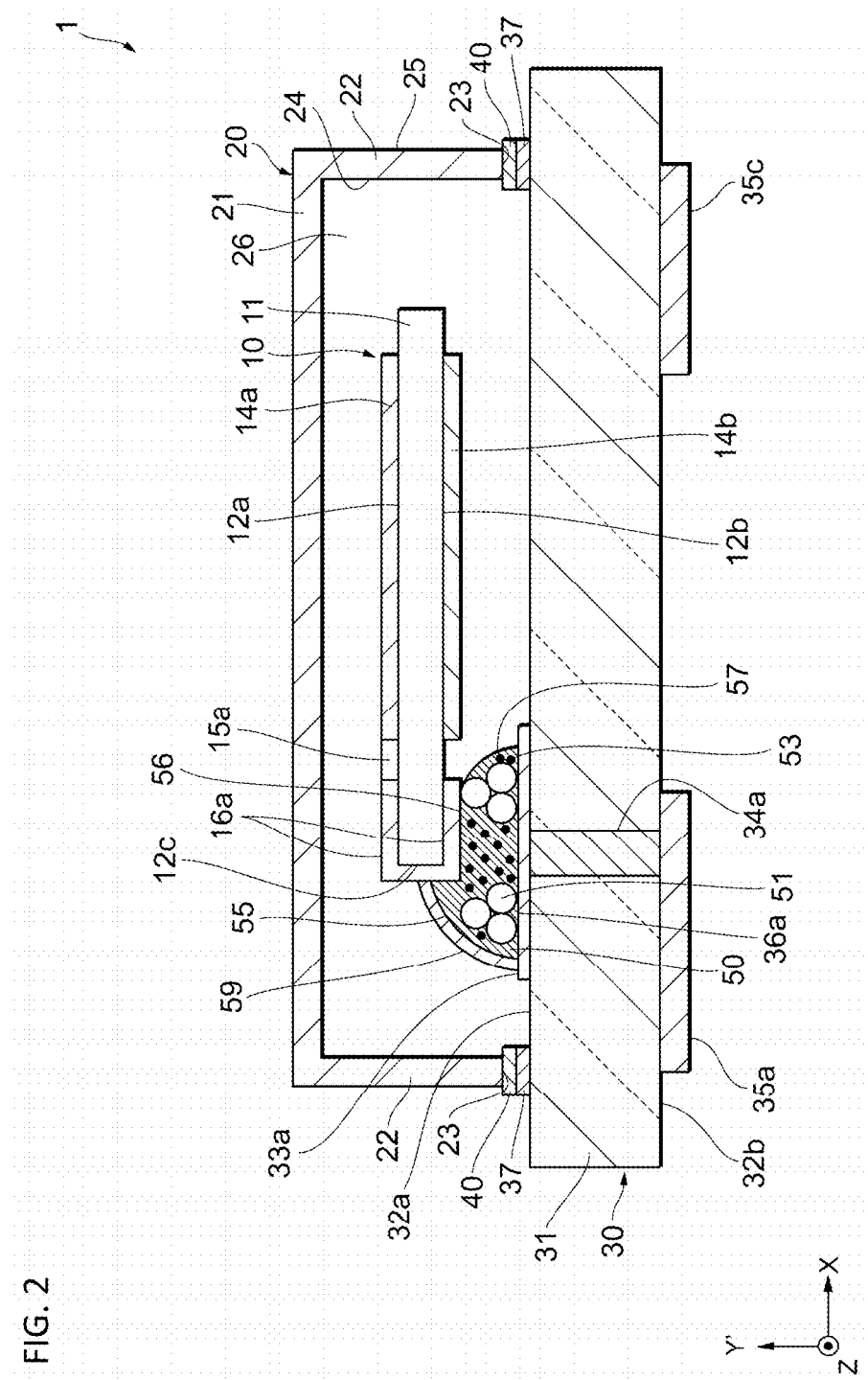
FIG. 2 is a schematic sectional view of the piezoelectric resonator unit shown in FIG. 1 taken along line II-II.
Figure 3:
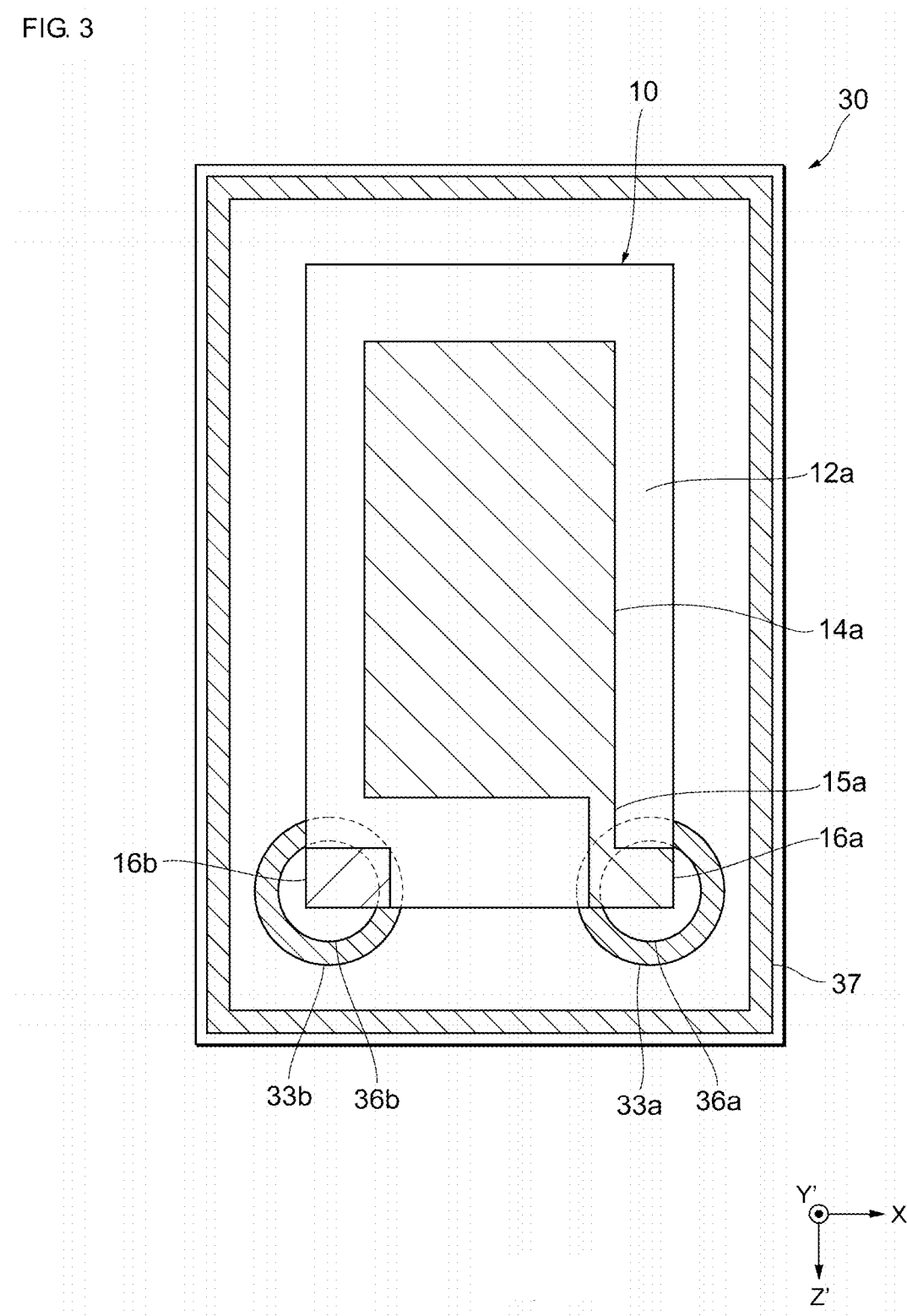
FIG. 3 is a plan view of the piezoelectric resonator unit shown in FIG. 1.

Referring to FIGS. 1 to 3, an exemplary structure of a piezoelectric resonator unit according to an embodiment of the present invention will be described by using a quartz crystal resonator unit as an example. However, a piezoelectric element according to an embodiment of the present invention quartz is not limited to a crystal element, and may be formed from another piezoelectric material, such as a ceramic. FIG. 1 is a schematic exploded perspective view of a piezoelectric resonator unit according to an embodiment of the present invention. FIG. 2 is a schematic sectional view of the piezoelectric resonator unit shown in FIG. 1 taken along line II-II. FIG. 3 is a plan view of the piezoelectric resonator unit shown in FIG. 1. In FIG. 3, a lid member 20 is omitted.

As illustrated in FIG. 1, a piezoelectric resonator unit 1 according to the present embodiment includes a piezoelectric resonator 10, a lid member 20, and a base member 30. The lid member 20 and the base member 30 are holders for accommodating the piezoelectric resonator 10. In the example illustrated in FIG. 1, the lid member 20 has a recessed shape, and the base member 30 has a flat plate-like shape.

The piezoelectric resonator 10 includes a piezoelectric element 11 having a thin plate-like shape. The piezoelectric element 11 has a first main surface 12a and a second main surface 12b that face each other. The piezoelectric element 11 has end surfaces 12c, 12d, 12e, and 12f that connect the first main surface 12a and the second main surface 12b. The first main surface 12a is positioned on a side opposite to a side facing the base member 30, and the second main surface 12b is positioned on the side facing the base member 30. In a case where the piezoelectric resonator 10 is a quartz crystal resonator, the piezoelectric element 11 is, for example, an AT-cut quartz crystal element. An AT-cut quartz crystal element is cut in such a way that the quartz crystal element has a main surface that is parallel to a plane defined by the X-axis and the Z'-axis (hereinafter, this plane will be referred to as "XZ'-plane", and the same applies to planes defined by the other axes). Here, the X-axis, the Y-axis, and the Z-axis are the crystallographic axes of a synthetic quartz crystal and the Y'-axis and the Z'-axis are respectively axes that are obtained by rotating the Y-axis and the Z-axis around the X-axis by 35 degrees 15 minutes±1 minute 30 seconds in a direction from the Y-axis toward the Z-axis. That is, in the piezoelectric element 11, which is an AT-cut quartz crystal element, the first main surface 12a and the second main surface 12b respectively correspond to the XZ'-planes. The cut angle of the quartz crystal element may be a cut that is different from AT cut (such as BT cut).

In the present exemplary structure, the piezoelectric element 11, which is an AT-cut quartz crystal element, has a long-side direction in which long sides, which are parallel to the X-axis direction, extend; a short-side direction in which long sides, which are parallel to the Z'-axis direction, extend; and a thickness direction in which a thickness, which is parallel to the Y'-axis direction, extends. The end surface 12c and the end surface 12f extend along short sides, which are parallel to the Z'-axis direction, and face each other. The end surface 12d and the end surface 12e respectively extend along long sides, which are parallel to the X-axis direction, and face each other. For example, the piezoelectric element 11 has a rectangular shape in the XZ'-plane. However, the shape is not limited to this, and may be a comb-like shape illustrated in FIG. 8. The piezoelectric element 11 has, for example, a flat plate-like structure whose thicknesses in the X-axis direction and the Z'-axis direction are respectively substantially uniform. However, the structure is not limited to this. For example, the piezoelectric element 11 may have a mesa structure in which an excitation portion, which contributes to excitation, is thicker than an end portion around the excitation portion, or may be an inverted mesa structure in which the excitation portion is thinner than an end portion. The piezoelectric element may have a convex shape or a beveled shape such that thicknesses of the excitation portion and the end portion continuously change.

A quartz crystal resonator using an AT-cut quartz crystal element has high frequency stability in a wide temperature range, has high durability, and can be manufactured at low cost. An AT-cut quartz crystal resonator uses a thickness shear vibration mode as main vibration.

The piezoelectric resonator 10 includes a first excitation electrode 14a and a second excitation electrode 14b, which constitute a pair of electrodes. The first excitation electrode 14a is disposed on a central part of the first main surface 12a. The second excitation electrode 14b is disposed on a central part of the second main surface 12b. The first excitation electrode 14a and the second excitation electrode 14b face each other with the piezoelectric element 11 therebetween. The first excitation electrode 14a and the second excitation electrode 14b are disposed in such a way that substantially the entireties thereof overlap in the XZ'-plane.

The first excitation electrode 14a and the second excitation electrode 14b each have long sides parallel to the X-axis direction, short sides parallel to the Z'-axis direction, and a thickness parallel to the Y'-axis direction. In the example illustrated in FIG. 1, in the XZ'-plane, the long sides of the first excitation electrode 14a and the second excitation electrode 14b are parallel to the long sides of the piezoelectric element 11. Likewise, the short sides of the first excitation electrode 14a and the second excitation electrode 14b are parallel to the short sides of the piezoelectric element 11. The long sides of the first excitation electrode 14a and the second excitation electrode 14b are separated from the long sides of the piezoelectric element 11, and the short sides of the first excitation electrode 14a and the second excitation electrode 14b are separated from the short sides of the piezoelectric element 11.

The piezoelectric resonator 10 includes a pair of extension electrodes 15a and 15b and a pair of connection electrodes 16a and 16b. The connection electrode 16a is electrically connected to the first excitation electrode 14a via the extension electrode 15a. The connection electrode 16b is electrically connected to the second excitation electrode 14b via the extension electrode 15b. The connection electrode 16a and the connection electrode 16b are terminals for electrically connecting the first excitation electrode 14a and the second excitation electrode 14b to the base member 30.

In the exemplary structure illustrated in FIGS. 1 to 3, the extension electrode 15a is continuous with the first excitation electrode 14a on the first main surface 12a. The extension electrode 15b is continuous with the second excitation electrode 14b on the second main surface 12b. The connection electrode 16a is continuous with the extension electrode 15a on the first main surface 12a, and extends to the end surface 12c and the second main surface 12b. The connection electrode 16b is continuous with the extension electrode 15b on the second main surface 12b, and extends to the end surface 12c and the first main surface 12a. The connection electrode 16a and the connection electrode 16b are arranged in the short-side direction (the Z'-axis direction) of the piezoelectric element 11. In the present exemplary structure, the connection electrode 16a and the connection electrode 16b extend also respectively to the end surface 12d and the end surface 12e. A part of the connection electrode 16a disposed on the end surface 12d faces a part of the connection electrode 16b disposed on the end surface 12e with the piezoelectric element 11 therebetween. By disposing the connection electrode 16a and the connection electrode 16b also on the end surface 12d and the end surface 12e, the area of contact between the connection electrode 16a and the connection electrode 16b and an electroconductive holding member 36a and an electroconductive holding member 36b described below can be increased. Thus, the electrical reliability of the piezoelectric resonator unit 1 can be improved. The connection electrode 16a and the connection electrode 16b may be arranged in the long-side direction (the X-axis direction) of the piezoelectric element 11. The connection electrode 16a and the connection electrode 16b may be respectively disposed near the center of a long side or a short side of the piezoelectric element 11 or may be disposed along different sides of the piezoelectric element 11. That is, in a plan view in a direction normal to the first main surface 12a or the second main surface 12b, the connection electrode 16a and the connection electrode 16b may be arranged in the Z'-axis direction or the X-axis direction with the excitation electrode 14a or the excitation electrode 14b therebetween.

The material of the first excitation electrode 14a and the second excitation electrode 14b, the extension electrodes 15a and 15b, and the connection electrodes 16a and 16b is not particularly limited. For example, the material may include a chromium (Cr) layer, as an underlying layer, on a side that contacts the piezoelectric element 11; and a gold (Au) layer, as an outermost layer, on a side opposite to the Cr layer. By forming a metal layer that has high reactivity with oxygen as the underlying layer, adhesion between the piezoelectric element 11 and the excitation electrodes 14a and 14b is increased. By forming a metal layer that has low reactivity with oxygen as the outermost layer, the electrical reliability of the excitation electrodes 14a and 14b is improved.

In the present exemplary structure, the electroconductive holding members 36a and 36b are formed by thermally curing an electroconductive adhesive. The electroconductive holding member 36a and the electroconductive holding member 36b respectively electrically connect the connection electrode 16a and the connection electrode 16b to a pair of electrode pads of the base member 30. The electroconductive holding members 36a and 36b excitably hold the piezoelectric resonator 10 on a third main surface 32a (front surface) of the base member 30. The electroconductive holding members 36a and 36b are not limited to a thermosetting adhesive, and may be formed from an energy-beam-curable adhesive, such as a UV-curable adhesive, or a mixed adhesive in which a curing agent is mixed.

The lid member 20 is joined to the base member 30, and thereby accommodates the piezoelectric resonator 10 in an inner space 26. The lid member 20 has an inner surface 24 and an outer surface 25, and has a recessed shape that is open toward the third main surface 32a of the base member 30, to be specific, a box shape that has an opening on the base member 30 side.

The lid member 20 includes a top panel 21 that faces the third main surface 32a of the base member 30, and a side wall 22 that is connected to an outer edge of the top panel 21 and that extends in a direction that intersects the main surface of the top panel 21. The shape of the lid member 20 is not limited, as long as the lid member 20 can accommodate the piezoelectric resonator 10. For example, the lid member 20 has a rectangular shape when seen in a plan view in a direction normal to the main surface of the top panel 21. The lid member 20 has, for example, a long-side direction in which long sides parallel to the X-axis direction extend, a short-side direction in which short sides parallel to the Z'-axis direction extend, and a height direction parallel to the Y'-axis direction. The lid member 20 has a facing surface 23, which faces the third main surface 32a of the base member 30, at the opening edge of the recessed shape (end surface of the side wall 22). The facing surface 23 extends in a frame-like shape so as to surround the periphery of the piezoelectric resonator 10.

The material of the lid member 20 is not particularly limited. For example, the material is an electroconductive material such as a metal. In this case, it is possible to additionally provide the lid member 20 with an electromagnetic shielding function of blocking electromagnetic radiation. For example, the lid member 20 is made of an alloy that includes iron (Fe) and Nickel (Ni) (such as 42 alloy). A gold (Au) layer or the like, for preventing oxidation and the like, may be formed on the outermost surface of the lid member 20. Alternatively, the lid member 20 may be made of an insulating material or may have a composite structure made of an electroconductive material and an insulating material.

The base member 30 excitably supports the piezoelectric resonator 10. To be specific, the piezoelectric resonator 10 is excitably held on the third main surface 32a of the base member 30 via the electroconductive holding members 36a and 36b.

The base member 30 has, for example, a flat plate-like shape. The base member 30 has a long-side direction in which long sides parallel to the X-axis direction extend, a short-side direction in which short sides parallel to the Z'-axis direction extend, and a thickness direction in which a thickness parallel to the Y'-axis direction extends.

The base member 30 includes a base body 31. The base body 31 has the third main surface 32a and a fourth main surface 32b (back surface), which face each other and which are XZ'-planes. The base body 31 is, for example, a sintered material such as an insulating ceramic (alumina). In this case, the base body 31 may formed by stacking a plurality of insulating ceramic green sheets and by sintering the stack. Alternatively, the base body 31 may be made from any of the following materials: an inorganic glass material (such as silicate glass, or a material whose main component is not silicate and in which a glass transition phenomenon occurs due to increase of temperature); a quartz material (such as an AT-cut quartz crystal); a heat-resistant engineering plastic (such as a polyimide resin or a liquid crystal polymer; and an organic-inorganic hybrid material (such as a fiber-reinforced plastic including an epoxy resin). Preferably, the base body 31 is made of a heat-resistant material. The base body 31 may include a single layer or multiple layers. If the base body 31 includes a multiple layers, the base body 31 includes an insulating layer as an outermost layer on the third main surface 32a side.

The base member 30 includes electrode pads 33a and 33b disposed on the third main surface 32a, and outer electrodes 35a, 35b, 35c, and 35d disposed on the fourth main surface 32b. The electrode pads 33a and 33b are terminals for electrically connecting the base member 30 and the piezoelectric resonator 10. The outer electrodes 35a, 35b, 35c, and 35d are terminals for electrically connecting a circuit board (not shown) and the piezoelectric resonator unit 1. The electrode pad 33a is electrically connected to the outer electrode 35a via a via-electrode 34a extending in the thickness direction. The electrode pad 33b is electrically connected to the outer electrode 35b via a via-electrode 34b extending in the thickness direction. The via-electrodes 34a and 34b are formed in via-holes that extend through the base body 31 in the thickness direction.

In the exemplary structure illustrated in FIG. 1, the electrode pads 33a and 33b of the base member 30 are disposed on the third main surface 32a near a short side of the base member 30 on one side in the long-side direction. That is, the electrode pads 33a and 33b are disposed separated from the short side of the base member 30 and arranged in the short-side direction. The electrode pad 33a is connected to the connection electrode 16a of the piezoelectric resonator 10 via the electroconductive holding member 36a. The electrode pad 33b is connected to the connection electrode 16b of the piezoelectric resonator 10 via the electroconductive holding member 36b.

The plurality of outer electrodes 35a, 35b, 35c, and 35d are respectively disposed near the corners of the fourth main surface 32b. In the example illustrated in FIG. 1, the outer electrodes 35a and 35b are disposed directly below the electrode pads 33a and 33b. Thus, the via-electrodes 34a and 34b, which extend in the thickness direction, can electrically connect the outer electrodes 35a and 35b to the electrode pads 33a and 33b. In the example illustrated in FIG. 1, among the four outer electrodes 35a to 35d, the outer electrodes 35a and 35b, which are disposed near a short side of the base member 30 on one side in the long-side direction, are input-output electrodes to which input-output signals of the piezoelectric resonator 10 are supplied. The outer electrodes 35c and 35d, which are disposed near a short side on the opposite side in the long-side direction of the base member 30, are dummy electrodes to which input-output signals of the piezoelectric resonator 10 are not supplied. To the dummy electrodes, input-output signals of other electronic devices on a mounting board (not shown), on which the piezoelectric resonator unit 1 is mounted, are not supplied. Alternatively, the outer electrodes 35c and 35d may be ground electrodes to which a ground potential is supplied. If the lid member 20 is made of an electroconductive material, the electromagnetic shielding function of the lid member 20 can be reinforced by connecting the lid member 20 to the outer electrodes 35c and 35d, which are ground electrodes.

A sealing frame 37 is disposed on the third main surface 32a of the base body 31. In the example illustrated in FIG. 1, the sealing frame 37 has a rectangular frame-like shape when seen in a plan view in a direction normal to the third main surface 32a. When seen in a plan view in the direction normal to the third main surface 32a, the electrode pads 33a and 33b are disposed inside of the sealing frame 37, and the sealing frame 37 surrounds the piezoelectric resonator 10. The sealing frame 37 is made of an electroconductive material. A joining member 40 described below is disposed on the sealing frame 37, and thereby the lid member 20 is joined to the base member 30 via the joining member 40 and the sealing frame 37.

In the present exemplary structure, the electrode pads 33a and 33b, the outer electrodes 35a to 35d, and the sealing frame 37 of the base member 30 are each composed of metal films. For example, the electrode pads 33a and 33b, the outer electrodes 35a to 35d, and the sealing frame 37 are each formed by stacking a molybdenum (Mo) layer, a nickel (Ni) layer, and a gold (Au) layer, in order from a side in contact with the base body 31 (lower layer) to a side separated from the base body 31 (upper layer). The via-electrodes 34a and 34b can be formed by filling via-holes in the base body 31 with a metal material, such as molybdenum (Mo).

The positional relationship among the electrode pads 33a and 33b and the outer electrodes 35a to 35d is not limited to the example described above. For example, the electrode pad 33a may be disposed near one short side of the base member 30, and the electrode pad 33b may be disposed near the other short side of the base member 30. In such a structure, the piezoelectric resonator 10 is held by the base member 30 at both end portions of the piezoelectric element 11 in the long-side direction.

The disposition of the outer electrodes is not limited to the example described above. For example, two of the outer electrodes that are input-output electrodes may be disposed at diagonal positions on the fourth main surface 32b. Alternatively, the four outer electrodes may be disposed near the centers of the sides of the fourth main surface 32b, instead of the corners. The number of outer electrodes is not limited to four. For example, there may be only two outer electrodes that are input-output electrodes. The connection electrodes and the outer electrodes need not be electrically connected to each other by using via-electrodes. The connection electrodes and the outer electrodes may be electrically connected to each other by extending extension electrodes to positions on the third main surface 32a or the fourth main surface 32b. Alternatively, the connection electrodes and the outer electrodes may be electrically connected to each other by forming the base body 31 of the base member 30 from multiple layers, extending a via-electrode to an intermediate layer, and drawing an extension electrode in the intermediate layer.

By joining the lid member 20 and the base member 30 via the sealing frame 37 and the joining member 40, the piezoelectric resonator 10 is sealed in the inner space (cavity) 26 surrounded by the lid member 20 and the base member 30. In this case, preferably, the inside of the inner space 26 is in a vacuum state in which pressure is lower than the atmospheric pressure, because the vacuum state can reduce change with time of frequency characteristics of the piezoelectric resonator unit 1 and the like due to oxidation of the first excitation electrode 14a and the second excitation electrode 14b.

The joining member 40 is formed around the entire peripheries the lid member 20 and the base member 30. To be specific, the joining member 40 is disposed on the sealing frame 37. Because the sealing frame 37 and the joining member 40 are interposed between the facing surface 23 of the side wall 22 of the lid member 20 and the third main surface 32a of the base member 30, the piezoelectric resonator 10 is sealed by the lid member 20 and the base member 30.

The joining member 40 is, for example, a brazing member having electroconductivity. To be specific, the joining member 40 is made of a gold-tin (Au—Sn) eutectic alloy, and metallically joins the lid member 20 and the base member 30. With metallic joining, hermeticity and joining strength can be improved. The joining member 40 is not limited to a brazing member having electroconductivity. For example, the joining member 40 may be a glass adhesive, such as low-melting-point glass (for example, lead borate glass, tin phosphate glass, or the like) or a resin adhesive. In this case, the joining member 40 can be formed at lower costs than metal joining, heating temperature can be reduced, and simplification and energy saving of the manufacturing process can be realized.

In the piezoelectric resonator 10 according to the present embodiment, one end of the piezoelectric element 11 in the long-side direction (end portion on a side on which the electroconductive holding members 36a and 36b are disposed) is a fixed end, and the other end is a free end. The piezoelectric resonator 10, the lid member 20, and the base member 30 each have a rectangular shape in the XZ'-plane, and have the same long-side direction and the short-side direction.

The position of the fixed end of the piezoelectric resonator 10 is not particularly limited. As described below, the piezoelectric resonator 10 may be fixed to the base member 30 at both ends of the piezoelectric element 11 in the long-side direction. In this case, the electrodes of the piezoelectric resonator 10 and the base member 30 may be formed in such a way that the piezoelectric resonator 10 is fixed at both ends of the piezoelectric element 11 in the long-side direction.

In the piezoelectric resonator unit 1 according to the present embodiment, an alternating electric field is applied between the pair of first and second the excitation electrodes 14a and 14b of the piezoelectric resonator 10 via the outer electrodes 35a and 35b of the base member 30. Thus, the piezoelectric element 11 vibrates in a predetermined vibration mode such as a thickness shear mode, and resonance characteristics can be obtained in accordance with the vibration.

Next, referring to FIG. 2, details of the structure of an electroconductive holding member will be described by using the electroconductive holding member 36a as an example. Detailed description of the electroconductive holding member 36b, which is similar to the electroconductive holding member 36a, will be omitted.

The electroconductive holding member 36a includes a binder 50, spacers 51, and electroconductive particles 53. An electroconductive material 59 is disposed on the surface of at least a part of the electroconductive holding member 36a. The binder 50 is a thermosetting resin, and may include another resin such as a UV-curable resin. The spacers 51 are, for example, fillers each having a substantially spherical shape, and are dispersed in the binder 50. Here, the term "substantially spherical shape" includes a spherical shape, an ellipsoidal shape, and the like. The spacers 51 each may have another shape, such as a columnar shape or a polyhedral shape. The spacers 51 are each made of, for example, a resin. Examples of the resin include an elastic rubber and a plastic such as a silicone resin. The spacers 51 may each be formed from an electroconductive material, or may be formed by coating an insulating material with an electroconductive material. By including the spacers 51, the electroconductive holding member 36a can easily hold the piezoelectric resonator 10 at a predetermined distance (for example, an integer multiple of the outer dimension of the spacers 51) from the base member 30.

The electroconductive particles 53 are each a particle in which, for example, a plurality of metal atoms are bonded, and are dispersed in the binder 50. The material of the electroconductive particles 53 is not particularly limited, and is, for example, silver (Ag) or the like. The electroconductive particles 53 each may have a composite structure (such as a structure in which a metal particle is coated with a protective film). The electroconductive particles 53, each having a composite structure, can, for example, suppress deterioration with time of electroconductivity of the electroconductive holding member by improving chemical stability and can suppress variation in electroconductivity of the electroconductive holding member by suppressing aggregation. In order that the electroconductive particles 53 can enter gaps between the plurality of the spacers 51, the outer dimension of each of the electroconductive particles 53 may be smaller than each gap formed between the spacers 51.

The electroconductive holding member 36a has surfaces 55 and 57 and an interface 56 with the piezoelectric resonator 10 on a side opposite to a side that contacts the electrode pad 33a in a direction parallel to the Y'-axis direction. The surface 55 is farther than the surface 57 from the second excitation electrode 14b. The surface 57 is closer than the surface 55 to the second excitation electrode 14b. In the present exemplary structure, the surface 55 is positioned outside of the piezoelectric resonator 10, and the surface 57 is positioned between the piezoelectric resonator 10 and the base member 30. The electroconductive material 59 is disposed on the surface 55. On the other hand, the electroconductive material 59 is not disposed on the interface 56. In the example illustrated in FIG. 2, the electroconductive material 59 is not disposed on the surface 57. The electroconductive material 59 has higher chemical stability than the electroconductive particles 53 and has high oxidation stability. The electroconductive material 59 includes, for example, gold (Au). The electroconductive material 59 is scattered from an electroconductive member disposed near the electroconductive holding member 36a and is deposited on the electroconductive holding member 36a. At least one of the electrode pad 33a, the sealing frame 37, the connection electrode 16a, the extension electrode 15a, and the first excitation electrode 14a corresponds to the electroconductive member. That is, the electroconductive material 59 is formed from the same material as the outermost layer of at least one of the electrode pad 33a, the sealing frame 37, the connection electrode 16a, the extension electrode 15a, and the first excitation electrode 14a.

Next, referring to FIG. 3, by using the electroconductive holding member 36a and the electrode pad 33a as an example, the relationships between sizes and the positions of an electroconductive holding member and an electrode pad when the XZ'-plane is seen in a plan view will be described. Detailed descriptions of the electroconductive holding member 36b and the electrode pad 33b, which are similar to the electroconductive holding member 36a and the electrode pad 33a, will be omitted.

In the present exemplary structure, when seen in a plan view in a direction normal to the first main surface 12a of the piezoelectric resonator 10, a part of the electroconductive holding member 36a is disposed at a position that is outside of the piezoelectric resonator 10, and a part of the electrode pad 33a is disposed at a position that is outside of the piezoelectric resonator 10. Moreover, a part of the electrode pad 33a is positioned outside of the electroconductive holding member 36a. The electroconductive holding member 36a and the electrode pad 33a each have a substantially circular shape. Here, the term "substantially circular shape" includes a circular shape and an elliptical shape. However, the shape of each of the electroconductive holding member 36a and the electrode pad 33a is not limited to this, and may be another shape, such as a polygonal shape.

To be specific, a part of the electroconductive holding member 36a overlaps the piezoelectric resonator 10, and the electroconductive holding member 36a surrounds one corner of the piezoelectric resonator 10. That is, the electroconductive holding member 36a is adjacent to the piezoelectric resonator 10 in the X-axis direction and the Z'-axis direction. Likewise, a part of the electrode pad 33a overlaps the piezoelectric resonator 10, and the electrode pad 33a surrounds one corner of the piezoelectric resonator 10. Moreover, the outer dimension of the electrode pad 33a in a plan view is larger than the outer dimension of the electroconductive holding member 36a in a plan view, and the entire periphery of the electroconductive holding member 36a is surrounded by the electrode pad 33a. It is not necessary that the entire periphery of the electroconductive holding member 36a be surrounded by the electrode pad 33a, and at least a part of the electroconductive holding member 36a may be adjacent to the electrode pad 33a. In such a structure, in view of efficiency of an attachment step described below, preferably, the electrode pad 33a is adjacent to the electroconductive holding member 36a at an end portion on a side separated from the central part (excitation electrode) of the piezoelectric resonator 10.

Figure 4:
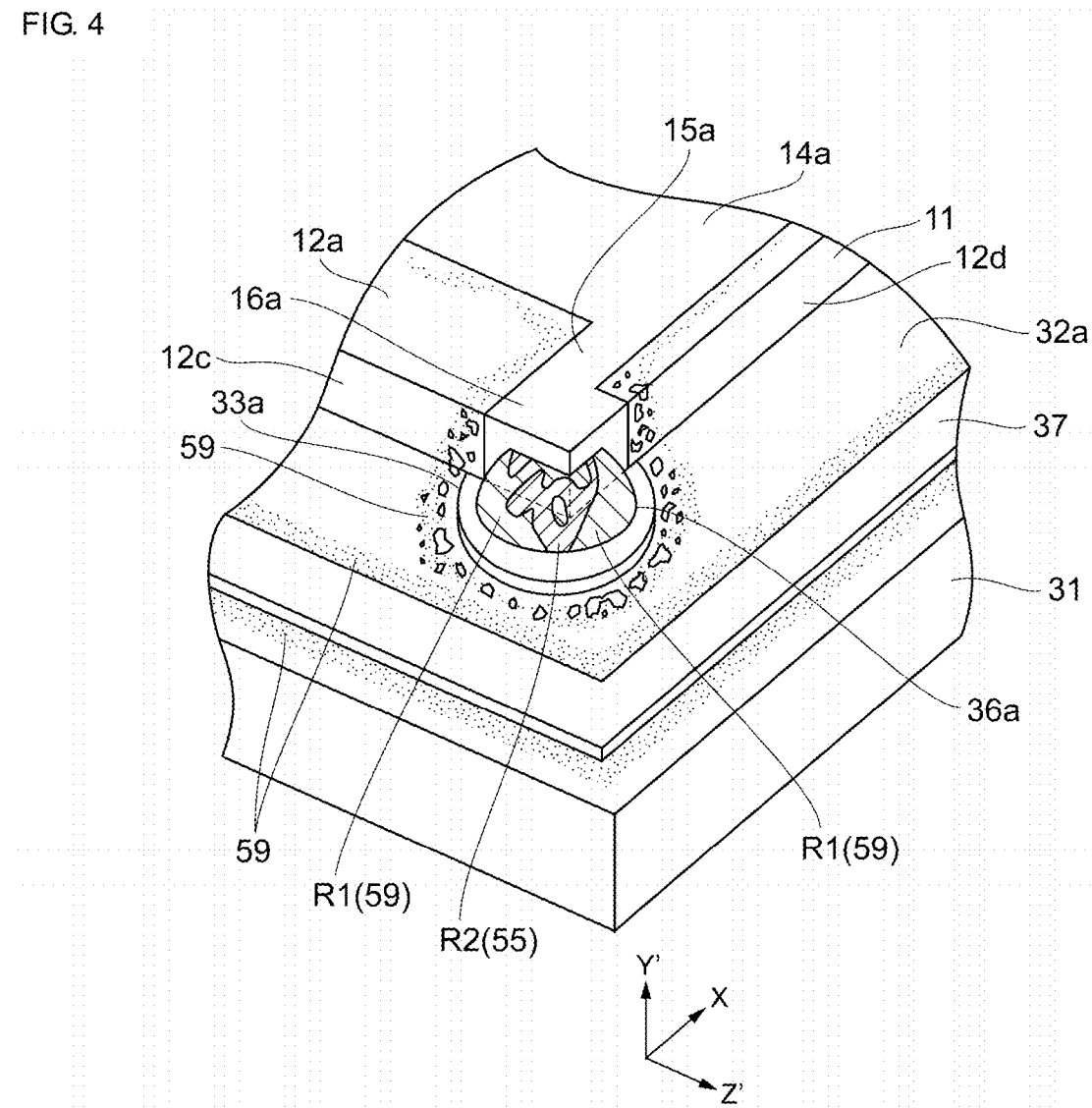
FIG. 4 is an enlarged perspective view of a part near a corner of the piezoelectric resonator shown in FIG. 1.

Next, referring to FIG. 4 and by using a part near the connection electrode 16a, the electroconductive holding member 36a, and the electrode pad 33a as an example, an exemplary arrangement of an electroconductive material in the piezoelectric resonator unit will be described. With the exemplary structure illustrated in FIGS. 1 to 3, because the connection electrode 16b is disposed also on the first main surface 12a, the electroconductive material 59 may be disposed in the same way in a part near the connection electrode 16b, the electroconductive holding member 36b, and the electrode pad 33b. FIG. 4 is an enlarged perspective view of a part near a corner of the piezoelectric resonator shown in FIG. 1.

The electroconductive material 59 is disposed in a mesh pattern on the electroconductive holding member 36a.

That is, on the electroconductive holding member 36a, a region R1, in which the surface 55 is covered by the electroconductive material 59, and a region R2, which is adjacent to the region R1 and in which the surface 55 is exposed to the inner space 26, are formed. The region R1 is, for example, adjacent to at least one of the electrode pad 33a and the connection electrode 16a. However, the region R1 is not limited to this, and may be formed like an island surrounded by the region R2. The area ratio (R1/R2) of the region R1 to the region R2 is large at a position near the electrode pad 33a and the connection electrode 16a. The area ratio is low at a position separated from the electrode pad 33a and the connection electrode 16a, that is, at a position near the midpoint between the electrode pad 33a and the connection electrode 16a. Likewise, the thickness of the electroconductive material 59 is large at a position near the electrode pad 33a and the connection electrode 16a and is small at a position separated from the electrode pad 33a and the connection electrode 16a.

The electroconductive material 59 is disposed also on the third main surface 32a of the base body 31. The electroconductive material on the third main surface 32a is positioned near the electrode pad 33a and the sealing frame 37. The proportion of the electroconductive material 59 in the third main surface 32a increases with decreasing distance from the electrode pad 33a and the sealing frame 37. The electroconductive material 59 is disposed also on the first main surface 12a and the end surfaces 12c and 12d of the piezoelectric element 11. The electroconductive material on the first main surface 12a and the end surfaces 12c and 12d is positioned near the connection electrode 16a, the extension electrode 15a, and the first excitation electrode 14a. The proportion of the electroconductive material in the first main surface 12a and the end surfaces 12c and 12d increases with decreasing distance from the connection electrode 16a, the extension electrode 15a, and the first excitation electrode 14a.

Figure 5:
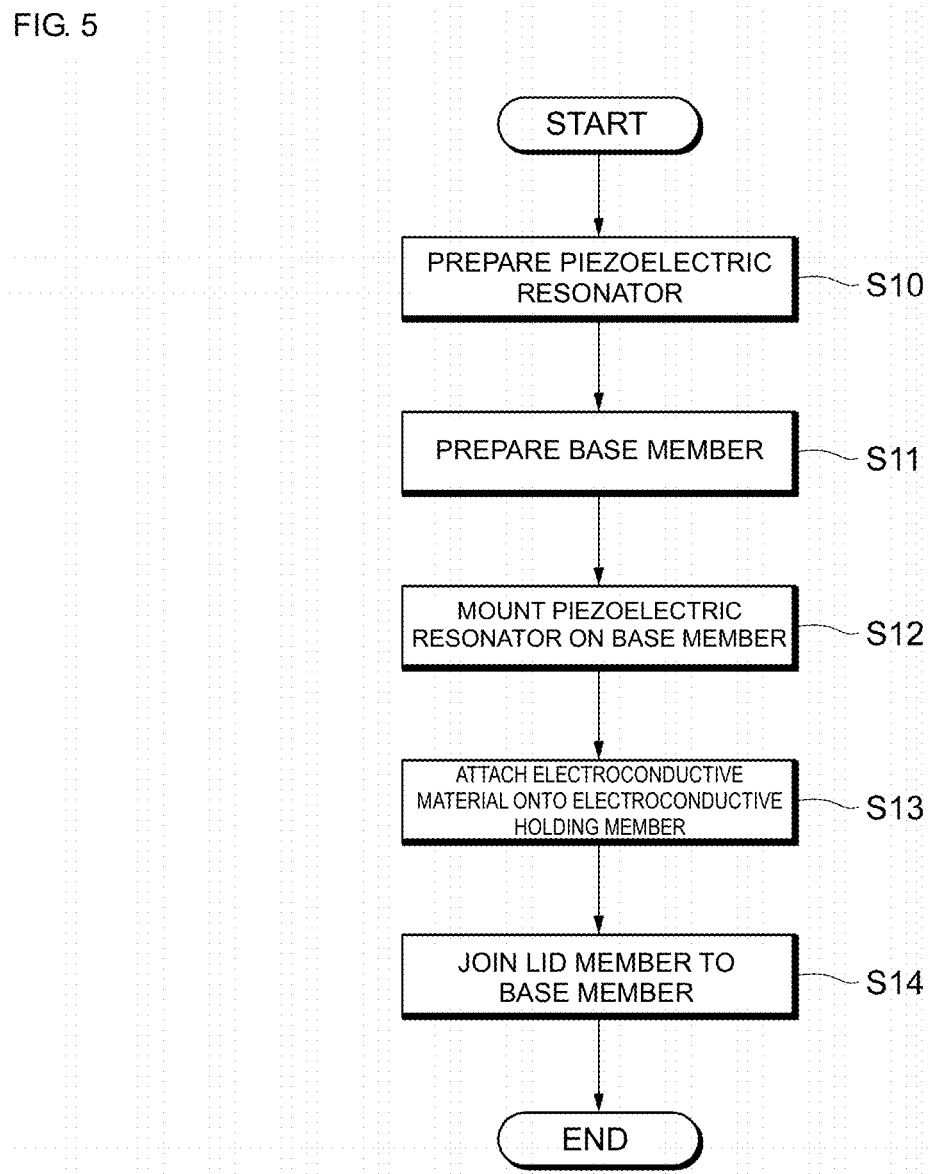
FIG. 5 is a flowchart of a method of manufacturing a piezoelectric resonator unit according to an embodiment of the present invention.
Figure 6:
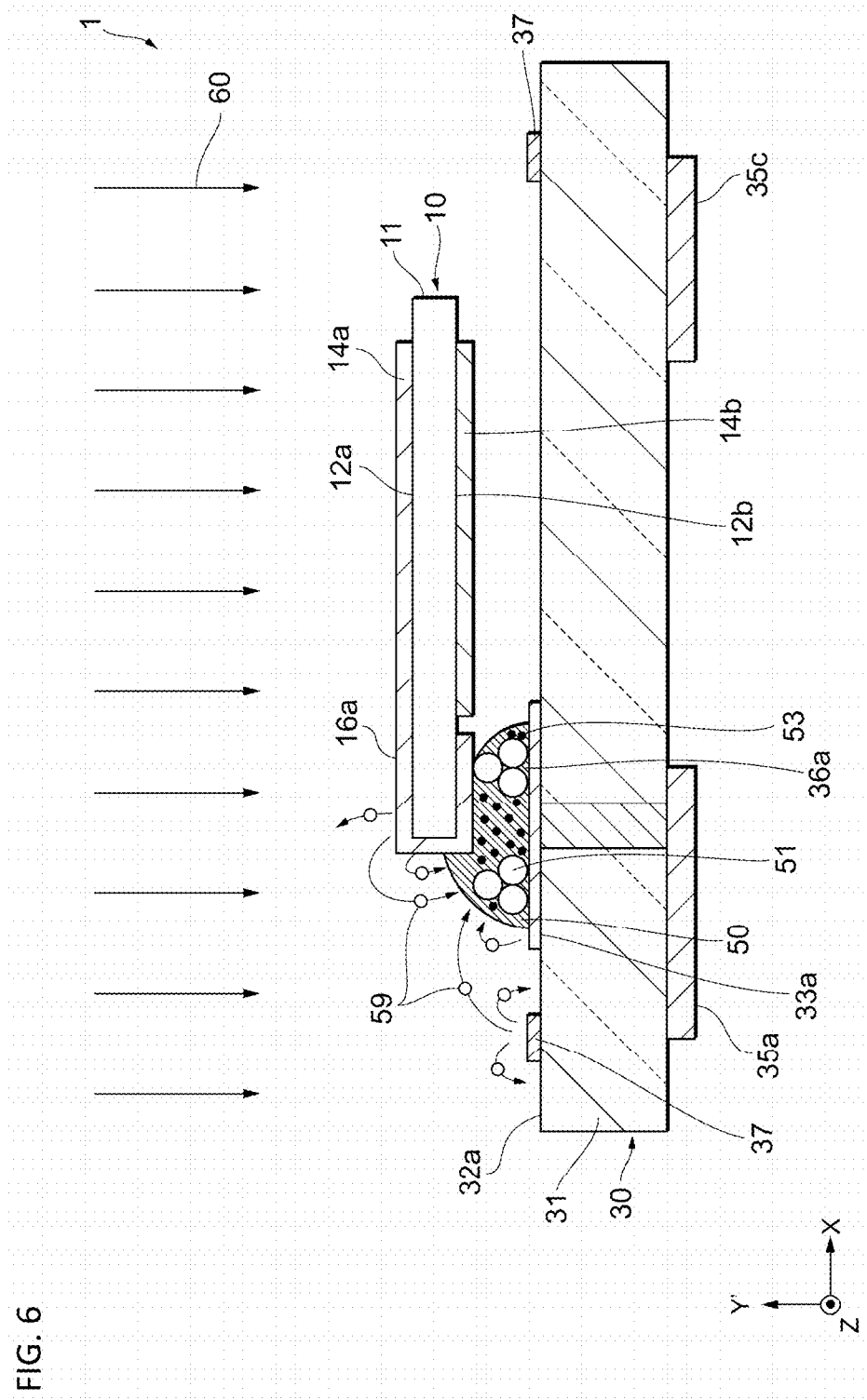
FIG. 6 illustrates an attachment step according to an embodiment of the present invention.

Next, referring to FIGS. 5 and 6, an example of a method of manufacturing a piezoelectric resonator unit according to the present embodiment will be described. FIG. 5 is a flowchart of a method of manufacturing a piezoelectric resonator unit according to an embodiment of the present invention. FIG. 6 illustrates an attachment step according to an embodiment of the present invention.

First, the piezoelectric resonator 10 is prepared (S10). Descriptions of a step of processing the piezoelectric element 11 and a step for forming various electrodes, which are general, will be omitted. In this example, the first excitation electrode 14a has the same thickness as the second excitation electrode 14b, and has the same thickness as the extension electrode 15a and the connection electrode 16a.

Next, the base member 30 is prepared (S11). Descriptions of a step of processing the base body 31 and a step of forming electrode pads and the like, which are general, will be omitted. At this time, the electroconductive material 59 is formed on the outermost surface of the electrode pad 33a.

Next, the piezoelectric resonator 10 is mounted on the base member 30 (S12). To be specific, an electroconductive adhesive is applied onto the electrode pads 33a and 33b on the third main surface 32a of the base body 31, and the electroconductive adhesive is thermally cured in the state in which the piezoelectric resonator 10 is mounted thereon. Thus, by using the electroconductive holding members 36a and 36b, which are formed by thermally curing the electroconductive adhesive, the connection electrodes 16a and 16b of the piezoelectric resonator 10 and the electrode pads 33a and 33b of the base member 30 are electrically connected. Moreover, by using the electroconductive holding members 36a and 36b, the piezoelectric resonator 10 is excitably held. The piezoelectric resonator 10 is mounted on the third main surface 32a in such a way that the second excitation electrode 14b faces the base member 30.

Next, the electroconductive material 59 is attached onto the electroconductive holding members 36a and 36b (S13 and FIG. 6). To be specific, from electroconductive members near the electroconductive holding members 36a and 36b, which are the various electrodes 14a, 15a, 16b, and 16a of the piezoelectric resonator 10 and the electrode pad 33a and the sealing frame 37 of the base member 30, the electroconductive material 59, which forms the outermost layer of each of these, is scattered so as to be attached to the surface of the electroconductive holding member 36a (attachment step). The attachment step is, for example, an ion milling step of performing irradiation with an ion beam 60 in a decompressed state. The ion beam 60 is emitted from above the first main surface 12a of the piezoelectric resonator 10. The ion milling step, which is an attachment step, may also function as a trimming step of removing the following foreign substances (particles): a quartz crystal adhered to the surface of the piezoelectric resonator 10; processing residues that include an electrode or a resin resist; dust in the atmosphere; and the like. Moreover, the ion beam 60 may also perform a trimming step of removing oxidized electroconductive particles that exist on the surfaces of the electroconductive holding members 36a and 36b. Therefore, by performing the ion milling step over the entireties of the piezoelectric resonator 10 and the base member 30 as illustrated in FIG. 6, the piezoelectric resonator 10 and the base member 30 can be cleaned. In the trimming step, the frequency of the piezoelectric resonator 10 can be adjusted by adjusting the amount of decrease of the thickness of the first excitation electrode 14a. Due to the skin effect, an electric signal is transmitted near the surface of a conductor as the frequency of the electric signal becomes high. Therefore, when the surface of the conductor reacts with a substance in the atmosphere and the electrical resistance of the surface increases due to oxidation or the like, the electrical resistance increases. The ion beam 60 can remove at least a part of a high-resistance layer that exists on the surfaces of the electroconductive holding members 36a and 36b. Moreover, because the ion beam 60 scatters the electroconductive material 59 made of gold (Au), which is more stable with respect to oxidation and which has a higher specific gravity than the electroconductive particles 53, which are made of, for example, silver (Ag), it is possible to attach a larger amount of gold (Au) than silver (Ag) to the surfaces of the electroconductive holding members 36a and 36b positioned near the electrode pads 33a and 33b and the connection electrodes 16a and 16b. That is, it is possible to make the deposition density of the electroconductive material 59 on the surfaces of the electroconductive holding members 36a and 36b higher than the deposition density of the electroconductive particles 53 on the surfaces. Thus, the resistance of the surfaces of the electroconductive holding members 36a and 36b is reduced. Because the ion beam 60 propagates in a direction normal to a first surface, the ion beam 60 is incident on the surface of the electroconductive member at substantially right angles and is incident on inclined side surfaces of the electroconductive holding members 36a and 36b at angles that are inclined compared with the substantially right angles.

The step S12 may be a multistep in which the trimming step and the attachment step are successively performed. In this case, in the trimming step, preferably, the entireties of the piezoelectric resonator 10 and the base member 30 are irradiated with an ion beam; and, in the attachment step, at least the electrode pad 33a may be irradiated with an ion beam. In a case where the trimming step and the attachment step are performed independently, it is possible to optimize the frequency of the piezoelectric resonator 10, which is adjusted in the trimming step, and it is possible to attach a sufficient amount of the electroconductive material 59, for providing electroconductivity, in the attachment step. In a case of performing the multistep, for example, the thickness of the first excitation electrode 14a and the thickness of the connection electrode 16a on the first main surface 12a may differ from each other. The attachment step may be performed by using another method, such as sputtering or vacuum deposition.

Lastly, the lid member 20 is joined to the base member 30 (S14). To be specific, the joining member 40 is disposed on the sealing frame 37 of the base member 30, the sealing frame 37 and the joining member 40 are interposed between the facing surface 23 of the side wall 22 of the lid member 20 and the third main surface 32a of the base member 30, and the lid member 20 is joined to the base member 30 under a decompressed condition. Thus, the piezoelectric resonator unit 1, in which the piezoelectric resonator 10 is accommodated in the inner space 26 formed by the lid member 20 and the base member 30, can be manufactured.

Figure 9:
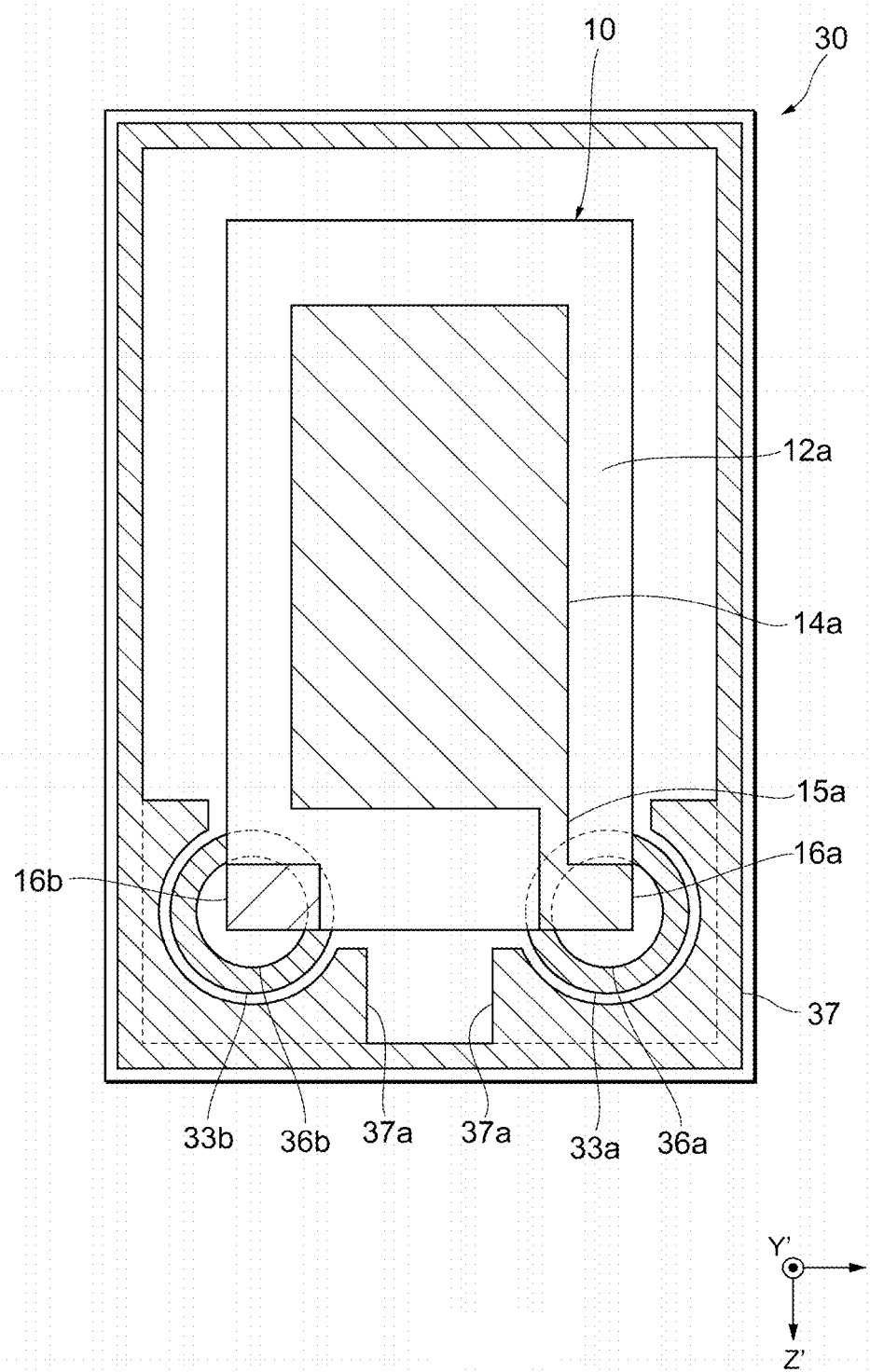
FIG. 9 is a schematic plan view of a piezoelectric resonator unit in which a sealing frame has a protruding portion, which is another example of an electroconductive member.
Figure 10:
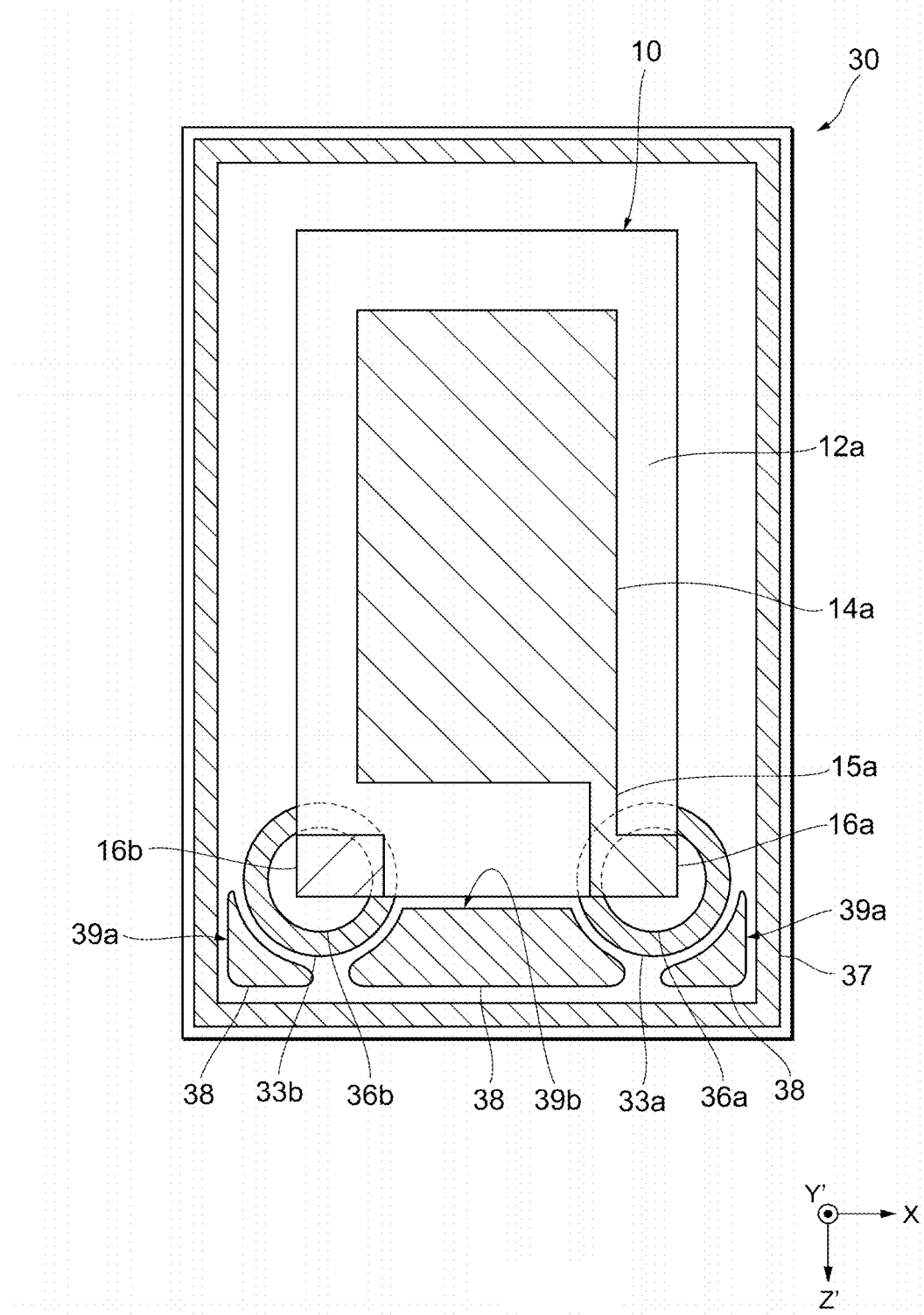
FIG. 10 is a schematic plan view of a piezoelectric resonator unit that has a floating electrode, which is another example of an electroconductive member.

An electroconductive member that is used to scatter an electroconductive material in the attachment step is not limited to the example described above. Next, referring to FIGS. 9 and 10, another example of an electroconductive member will be described. FIG. 9 is a schematic plan view of a piezoelectric resonator unit in which a sealing frame has a protruding portion, which is another example of an electroconductive member. FIG. 10 is a schematic plan view of a piezoelectric resonator unit that has a floating electrode, which is another example of an electroconductive member.

In the exemplary structure illustrated in FIG. 9, the sealing frame 37 includes protruding portions 37a that protrude toward the electroconductive holding members 36a and 36b. The protruding portions 37a of the sealing frame 37 protrude into a sealed space (the inner space 26), which is sealed by the base member 30 and the lid member 20. The protruding portions 37a are not in contact with and are electrically insulated from the electroconductive holding members 36a and 36b. The protruding portions 37a extend to positions that are on the third main surface 32a of the base member 30 and that are outside of the piezoelectric resonator 10 in a plan view of the third main surface 32a, that is, positions that do not overlap the piezoelectric resonator 10.

In the exemplary structure illustrated in FIG. 10, floating electrodes 38 are disposed around the electroconductive holding members 36a and 36b on the base member 30. The floating electrodes 38 are disposed on the third main surface 32a of the base member 30. The floating electrodes 38 are not in contact with and are electrically insulated from electroconductive members therearound, such as the sealing frame 37 and the electrode pads 33a and 33b. The floating electrodes 38 are disposed between the sealing frame 37 and the electroconductive holding members 36a and 36b. In other words, the floating electrodes 38 are disposed at corner positions 39a, which are inside the sealing frame 37 having a substantially rectangular shape and which face the electroconductive holding members 36a and 36b. The floating electrode 38 is also disposed at a position 39b between the electroconductive holding member 36a and the electroconductive holding member 36b. The floating electrode 38 may be disposed only at one of the positions 39a and the position 39b.

The protruding portions 37a and the floating electrodes 38 also correspond to an electroconductive member, as with the connection electrodes 16a and 16b, the electrode pads 33a and 33b, and the sealing frame 37. That is, the protruding portions 37a and the floating electrodes 38 can be a supply source of the electroconductive material 59 to be attached to the electroconductive holding members 36a and 36b. In particular, compared with a structure in which the sealing frame 37 is a supply source of the electroconductive material 59, because the protruding portions 37a and the floating electrodes 38 can be disposed closer than the sealing frame 37 to the electroconductive holding members 36a and 36b, it is possible to increase the amount of the electroconductive material 59 attached to the electroconductive holding members 36a and 36b.

As described above, according to an aspect of the present invention, there is provided a method of manufacturing a piezoelectric resonator unit including: a step of preparing the piezoelectric resonator 10 that includes the piezoelectric element 11, the pair of excitation electrodes 14a and 14b that are respectively disposed on the first main surface 12a and the second main surface 12b of the piezoelectric element 11 so as to face each other with the piezoelectric element 11 therebetween, and the pair of connection electrodes 16a and 16b that are respectively electrically connected to the pair of excitation electrodes 14a and 14b; a holding step of, by using the electroconductive holding members 36a and 36b including the electroconductive particles 53, electrically connecting the pair of connection electrodes 16a and 16b to the pair of electrode pads 33a and 33b that are disposed on the third main surface 32a of the base member 30 and excitably holding the piezoelectric resonator 10 on the third main surface 32a of the base member 30; and an attachment step of attaching the electroconductive material 59, which is scattered from the electroconductive member, to the surface 55 of the electroconductive holding members 36a and 36b. For example, the attachment step includes scattering a part of the pair of electrode pads 33a and 33b onto the electroconductive holding members 36a and 36b.

According to another aspect of the present invention, there is provided a piezoelectric resonator unit that includes the piezoelectric resonator 10 that includes the piezoelectric element 11, the pair of excitation electrodes 14a and 14b that are respectively disposed on the first main surface 12a and the second main surface 12b of the piezoelectric element 11 so as to face each other with the piezoelectric element 11 therebetween, and the pair of connection electrodes 16a and 16b that are respectively electrically connected to the pair of excitation electrodes 14a and 14b; the base member 30 that has the third main surface 32a on which the pair of electrode pads 33a and 33b are disposed; the electroconductive holding members 36a and 36b that include the electroconductive particles 53, that electrically connect the pair of electrode pads 33a and 33b respectively to the pair of connection electrodes 16a and 16b, and that excitably hold the piezoelectric resonator 10 on the third main surface 32a of the base member 30; and the electroconductive material 59 that is disposed on at least a part of the surface 55 of the electroconductive holding members 36a and 36b, the part of the surface 55 excluding the interface 56 between the electroconductive holding member 36a and 36b and the piezoelectric resonator 10. The electroconductive material 59 is formed from a material that is the same as the material of an outermost layer of each of the pair of electrode pads 33a and 33b.

With the aspects described above, even if the electroconductivity of the electroconductive holding member decreases when a part of the electroconductive particles becomes oxidized due to heating in a step of thermally curing or a step of annealing the electroconductive adhesive, electroconductivity between the electrode pads and the connection electrodes can be maintained sufficiently high due to the electroconductive material attached onto the electroconductive holding member. Accordingly, it is possible to provide a piezoelectric resonator unit and a method of manufacturing a piezoelectric resonator unit with which reliability can be improved. If the electroconductive member is an electrode pad adjacent to the electroconductive holding member, it is possible to increase the deposition density of the electroconductive material on the surface of the electroconductive holding member.

For example, when seen in a plan view in a direction normal to the first main surface 12a of the piezoelectric element 11, a part of each of the electroconductive holding members 36a and 36b is disposed at a position outside of the piezoelectric resonator 10. In this case, it is possible to efficiently attach the electroconductive material, which is scattered, to the electroconductive holding member in the attachment step.

For example, when seen in a plan view in a direction normal to the first main surface 12a of the piezoelectric element 11, a part of each of the electrode pads 33a and 33b is disposed at a position outside of the piezoelectric resonator 10. In this case, it is possible to efficiently scatter the electroconductive material from the electrode pad in the attachment step.

For example, the attachment step is an ion milling step of irradiating the electroconductive member and the electroconductive holding members 36a and 36b with the ion beam 60 in a decompressed state. In this case, it is possible to clean the piezoelectric resonator and the base member in the attachment step.

For example, the attachment step includes scattering a part of the pair of connection electrodes 16a and 16b onto the electroconductive holding members 36a and 36b. In this case, it is possible to increase the amount of the electroconductive material attached onto the electroconductive holding member.

For example, the pair of excitation electrodes include the first excitation electrode 14a disposed on the first main surface 12a of the piezoelectric element 11 and the second excitation electrode 14b disposed on the second main surface 12b of the piezoelectric element 11; the second main surface 12b is positioned on a side close to the third main surface 32a of the base member 30; the pair of connection electrodes 16a and 16b include the first connection electrode 16a that is disposed on the second main surface 12b of the piezoelectric element 11 and that is electrically connected to the first excitation electrode 14a and the second connection electrode 16b that is disposed on the second main surface 12b of the piezoelectric element 11 and that is electrically connected to the second excitation electrode 14b; and the second connection electrode 16b extends from the second main surface 12b to the first main surface 12a of the piezoelectric element 11. In this case, it is possible to efficiently attach the electroconductive material, which is scattered from the second connection electrode, onto the electroconductive holding member 36b.

For example, the electroconductive sealing frame 37 is disposed on the third main surface 32a of the base member 30 so as to surround the piezoelectric resonator 10, and the attachment step includes scattering the electroconductive material from the sealing frame 37. In this case, it is possible to increase the amount of electroconductive material attached to the electroconductive holding member.

Moreover, the sealing frame 37 may include, toward the electroconductive holding members 36a and 36b, the protruding portions 37a that are disposed at positions that do not overlap the piezoelectric resonator 10 when the third main surface 32a of the base member 30 is seen in a plan view, the protruding portions 37a protruding into a sealed space (the inner space 26). In this case, it is possible to increase the amount of electroconductive material attached to the electroconductive holding member by attaching a metal material, which is scattered by irradiating the protruding portion with an ion beam, onto the electroconductive holding member.

The floating electrodes 38 that are disposed around the electroconductive holding members 36a and 36b, that are not in contact with the sealing frame 37, and that are electrically insulated from surroundings may be further provided; and the attachment step may include scattering the electroconductive material from the floating electrode 38. The floating electrodes 38 can be disposed at the corner positions 39a that are inside of the substantially rectangular the sealing frame 37 and that face the electroconductive holding members 36a and 36b. Alternatively, when the piezoelectric resonator 10 is held at one end portion thereof by the electroconductive holding members 36a and 36b, the floating electrode 38 can be disposed at the position 39b between the two electroconductive holding members 36a and 36b. In this case, it is possible to increase the amount of electroconductive material attached to the electroconductive holding member by attaching a metal material, which is scattered by irradiating the floating electrode with an ion beam, to the electroconductive holding member.

For example, the attachment step includes forming the first region R1 in which the electroconductive holding members 36a and 36b are covered with the electroconductive material 59 and a second region R1 that is adjacent to the first region R1 and in which the electroconductive holding members 36a and 36b are exposed. Also with such an exemplary structure, it is possible to obtain advantageous effects similar to those described above.

For example, the electroconductive material 59 includes a material that is superior to the electroconductive particles 53 in oxidation stability. In this case, it is possible to suppress deterioration with time of the electroconductivity between the connection electrodes and the electrode pads. The specific gravity of the electroconductive material 59 is higher than the specific gravity of the electroconductive particles 53. In this case, in the attachment step, it is possible to scatter electroconductive particles that exist on the surface of the electroconductive holding member by a long distance and to scatter the electroconductive material to a position near the electroconductive member. That is, it is possible to increase the deposition density of the electroconductive material on the electroconductive holding member and to increase the electroconductivity between the electrode pads and the connection electrodes.

For example, the electroconductive material 59 includes gold. In this case, it is possible to suppress deterioration with time of the electroconductivity between the connection electrodes and the electrode pads.

Next, modifications of the piezoelectric resonator unit 1 according to the present embodiment will be described. In the following modifications, description of matters that are common to the embodiment described above will be omitted, and only differences will be described. In particular, similar advantageous effects obtained from similar structures will not be described.

<First Modification>

Figure 7:
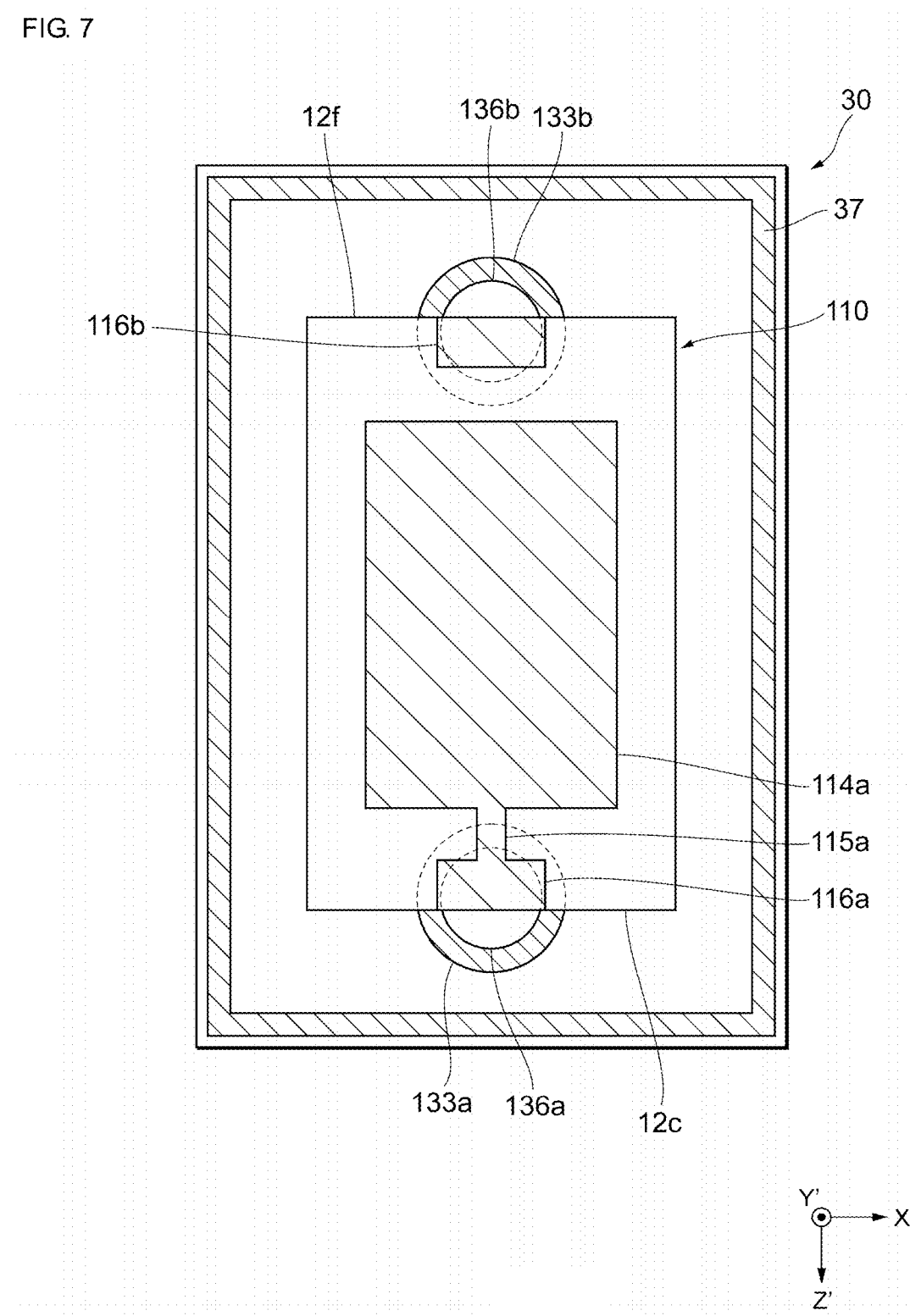
FIG. 7 is a schematic plan view of a piezoelectric resonator unit according to a first modification of the present embodiment.

FIG. 7 is a schematic plan view of a piezoelectric resonator unit according to a first modification of the present embodiment. In the first modification, a connection electrode 116a is disposed at a central portion of an end surface 12c of a piezoelectric resonator 110, and a connection electrode 116b is disposed at a central portion of an end surface 12f of the piezoelectric resonator 110. That is, electroconductive holding members 136a and 136b are disposed in such a way that a first excitation electrode 114a is interposed therebetween when seen in a plan view in a direction normal to the first main surface 12a. Thus, the piezoelectric resonator 110 is excitably held at a pair of short sides thereof.

<Second Modification>

Figure 8:
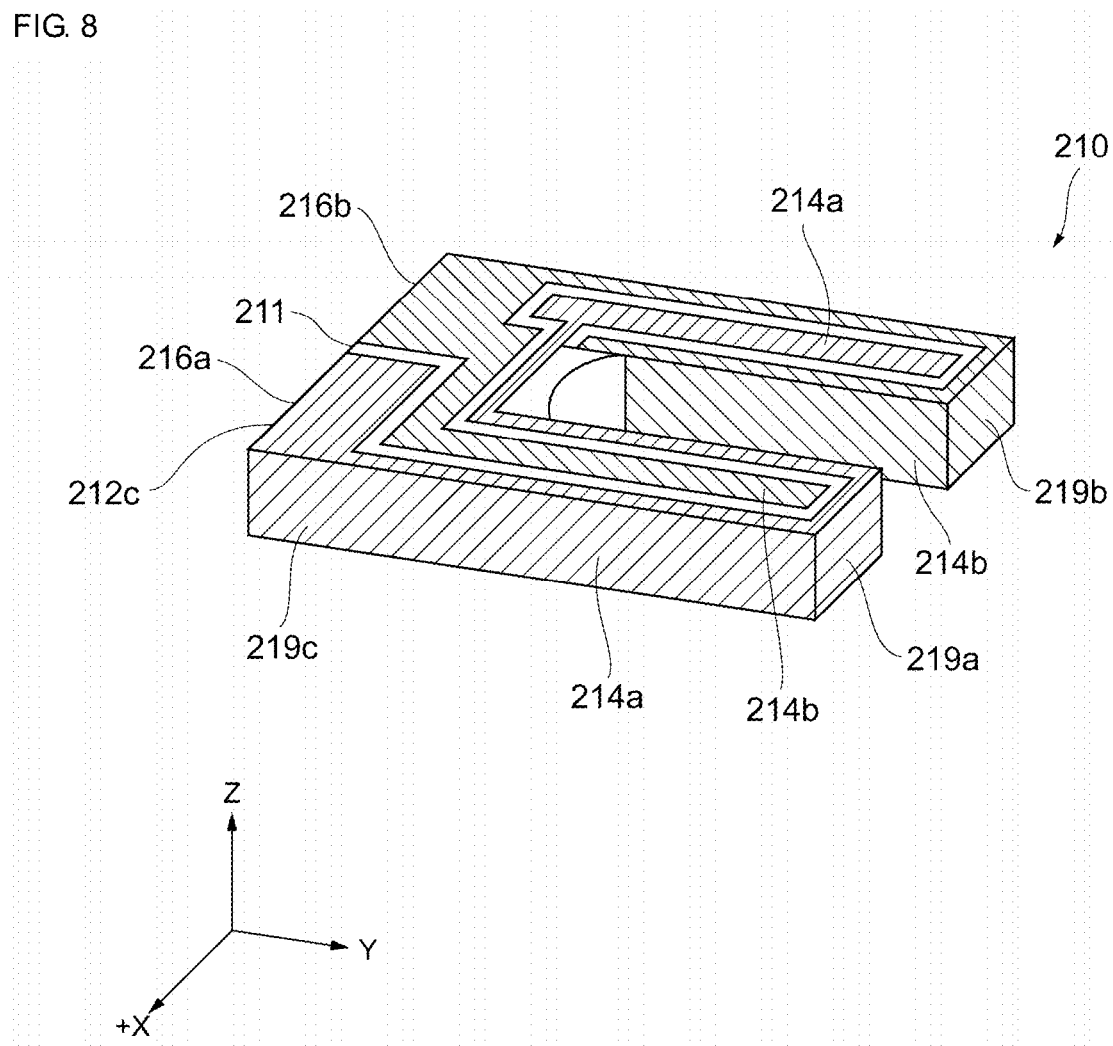
FIG. 8 is a schematic exploded perspective view of a piezoelectric resonator according to a second modification of the present embodiment.

FIG. 8 is a schematic exploded perspective view of a piezoelectric resonator unit according to a second modification of the present embodiment. The second modification differs from the exemplary structure illustrated in FIG. 1 in that the shape of a piezoelectric resonator 210 is a tuning-fork type. To be specific, a piezoelectric element 211 includes two tuning-fork-arm portions 219a and 219b that are disposed parallel to each other. The tuning-fork-arm portions 219a and 219b extend in the Y-axis direction, are arranged in the X-axis direction, and are joined to each other at a coupling portion 219c on the end surface 212c side. In the tuning-fork-arm portion 219b, excitation electrodes 214a are respectively disposed on a pair of main surfaces that are parallel to the XY-plane and that face each other, and excitation electrodes 214b are respectively disposed on a pair of side surfaces that intersect the pair of main surfaces and that face each other. In the tuning-fork-arm portion 219a, excitation electrodes 214b are respectively disposed on a pair of main surfaces, and excitation electrodes 214a are respectively disposed on a pair of side surfaces. The structure of the piezoelectric resonator 210 is not particularly limited, and the shape of the tuning-fork-arm portion and the disposition of the excitation electrodes may be different.

With each of the first and second modifications, it is possible to obtain advantageous effects that are the same as those described above.

In the present embodiment, the base member is a flat plate, and the lid member has a recessed shape. However, in the present invention, the shapes of the base member and the lid member are not particularly limited, as long as the piezoelectric resonator can be accommodated in an inner space. For example, the base member may have a recessed shape, and the lid member may be a flat plate.

The embodiments, which have been described above in order to facilitate understanding the present invention, do not limit the scope of the present invention. The present invention may be modified within the spirit and scope thereof and includes the equivalents thereof. That is, a modification of each of the embodiments that is appropriately modified in design by a person having ordinary skill in the art is included in the scope of the present invention as long as the modification has the features of the present invention. For example, elements included in each of the embodiment; and the dispositions, the materials, the shapes, and the sizes of the elements are not limited to those described above as examples and may be modified as appropriate. Elements included in each of the embodiments may be used in a combination as long as the combination is technologically feasible, and such combination is also included in the scope of the present invention as long as the combination has the features of the present invention.

REFERENCE SIGNS LIST 1 piezoelectric resonator unit
10 piezoelectric resonator
11 piezoelectric element
12a, 12b main surface
14a, 14b excitation electrode
15a, 15b extension electrode
16a, 16b connection electrode
30 base member
31 base body
32a, 32b main surface
33a, 33b electrode pad
36a, 36b electroconductive holding member
37 sealing frame
37a protruding portion
38 floating electrode
50 binder
51 spacer
53 electroconductive particle
59 electroconductive material

The invention claimed is:

1. A piezoelectric resonator unit comprising:
a piezoelectric resonator that includes a piezoelectric element, a pair of excitation electrodes that are respectively disposed on a first main surface and a second main surface of the piezoelectric element so as to face each other with the piezoelectric element therebetween, and a pair of connection electrodes that are respectively electrically connected to the pair of excitation electrodes;

a base member that has a third main surface;

a pair of electrode pads disposed on the third main surface;

an electroconductive holding member that includes electroconductive spacers and electroconductive particles dispersed in a binder, that electrically connects the pair of electrode pads respectively to the pair of connection electrodes, and that holds the piezoelectric resonator on the third main surface of the base member, wherein a particle size of the electroconductive particles is smaller than a particle size of the electroconductive spacers; and an electroconductive material on at least a part of a surface of the electroconductive holding member, the part of the surface excluding an interface between the electroconductive holding member and the piezoelectric resonator, wherein the electroconductive material is formed from a material that is the same as a material of an outermost surface of each of the pair of electrode pads.

2. The piezoelectric resonator unit according to claim 1, wherein the electroconductive material includes gold.

3. The piezoelectric resonator unit according to claim 1, wherein the material of the electroconductive material is superior in oxidation stability as compared to the electroconductive particles.

4. The piezoelectric resonator unit according to claim 1, wherein a specific gravity of the electroconductive material is higher than a specific gravity of the electroconductive particles.

5. The piezoelectric resonator unit according to claim 4, wherein the electroconductive material includes gold.

* * * * *